US012782433B2

(12) United States Patent
Tu et al.

(10) Patent No.: US 12,782,433 B2
(45) Date of Patent: Nov. 3, 2026

(54) DETECTION PANEL FOR DETECTING LIGHT-EMITTING UNIT AND DETECTION DEVICE INCLUDING THEREOF

(71) Applicant: Industrial Technology Research Institute, Hsinchu (TW)

(72) Inventors: Fu-An Tu, Hsinchu County (TW); Ming-Hsien Wu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 405 days.

(21) Appl. No.: 18/393,681

(22) Filed: Dec. 22, 2023

(65) Prior Publication Data

US 2025/0180641 A1 Jun. 5, 2025

(30) Foreign Application Priority Data

Nov. 30, 2023 (TW) ................................ 112146654

(51) Int. Cl.
*G01R 31/302* (2006.01)
*G01R 31/312* (2006.01)

(52) U.S. Cl.
CPC ....... *G01R 31/3025* (2013.01); *G01R 31/312* (2013.01)

(58) Field of Classification Search
CPC .............. G01R 31/302; G01R 31/3025; G01R 31/303; G01R 31/308; G01R 31/309; G01R 31/311; G01R 31/312; G01R 31/2635

(Continued)

(56) References Cited

U.S. PATENT DOCUMENTS 10,564,126 B2 2/2020 Nakamura
10,600,697 B2 3/2020 Henley
(Continued)

FOREIGN PATENT DOCUMENTS

CN 105021947 A * 11/2015
CN 111610177 9/2020
(Continued)

OTHER PUBLICATIONS

Hua et al.; Translation of CN 105021947 A; Nov. 4, 2015; Translated by EPO & Google (Year: 2015).*
(Continued)

*Primary Examiner* — Alesa Allgood
*Assistant Examiner* — Rahul Maini
(74) *Attorney, Agent, or Firm* — JCIPRNET

(57) ABSTRACT

A detection panel for detecting a light-emitting unit including a substrate and a plurality of detection units is provided. The plurality of detection units are disposed on the substrate, wherein one of the plurality of detection units includes a first detection electrode and a second detection electrode, and there is a first specific distance between the first detection electrode and the second detection electrode. There is a second specific distance between the plurality of detection units and the corresponding light-emitting unit, and the plurality of detection units detect an electrical property generated after the light-emitting unit is illuminated with light to determine whether the light-emitting unit has defects or not. A detection device including the detection panel is also provided.

19 Claims, 12 Drawing Sheets

(58) Field of Classification Search
USPC .......................................................... 324/501
See application file for complete search history.

(56) References Cited

U.S. PATENT DOCUMENTS

| | | | | |
|---|---|---|---|---|
| 10,962,586 | B2 | 3/2021 | Henley | |
| 10,989,755 | B2 | 4/2021 | Henley | |
| 11,002,783 | B2 | 5/2021 | Lin et al. | |
| 11,037,841 | B2 | 6/2021 | Henley | |
| 2007/0074914 | A1* | 4/2007 | Geaghan | G06F 3/0445 178/18.06 |
| 2007/0170933 | A1* | 7/2007 | Ma | G01R 31/2635 324/754.03 |
| 2014/0056028 | A1* | 2/2014 | Nichol | G02B 6/0015 362/616 |
| 2019/0004105 | A1 | 1/2019 | Henley | |
| 2020/0185283 | A1 | 6/2020 | Henley | |
| 2020/0200817 | A1* | 6/2020 | Lin | G01R 31/2635 |
| 2023/0184819 | A1 | 6/2023 | Lin et al. | |
| 2023/0341455 | A1 | 10/2023 | Liu | |
| 2023/0417817 | A1* | 12/2023 | Wang | G01R 31/2635 |

FOREIGN PATENT DOCUMENTS

| | | |
|---|---|---|
| TW | 202024661 | 7/2020 |
| TW | 202201035 | 1/2022 |
| TW | I758088 | 3/2022 |

OTHER PUBLICATIONS

"Office Action of Taiwan Counterpart Application", issued on Jun. 20, 2024, p. 1-p. 9.

* cited by examiner

DETECTION PANEL FOR DETECTING LIGHT-EMITTING UNIT AND DETECTION DEVICE INCLUDING THEREOF

CROSS-REFERENCE TO RELATED APPLICATION

This application claims the priority benefit of Taiwan application serial no. 112146654, filed on Nov. 30, 2023. The entirety of the above-mentioned patent application is hereby incorporated by reference herein and made a part of this specification.

BACKGROUND

Technical Field

The disclosure relates to a detection panel for detecting a light-emitting unit and a detection device including thereof.

Description of Related Art

With the development of display technology regarding light-emitting diodes, the size of light-emitting diodes is gradually reduced to several microns. Therefore, when detecting the light-emitting diodes, it is difficult for the probe of the detection device to align with the electrode of the light-emitting diodes, and the size of the tip of the probe needs to be designed to match the size of the electrode of the light-emitting diodes. Since the probe with an extremely small tip is difficult to be produced, and the tip of the probe needs to be in contact with the electrode of the light-emitting diode during the detection process, it is easy to cause defects in the electrode of the light-emitting diode and/or the loss of the probe. In addition, in the existing detection method of light-emitting diodes, the probe needs to contact the plurality of electrodes of the light-emitting diodes sequentially, so the detection process requires much time and effort.

SUMMARY

The disclosure provides a detection panel for detecting a light-emitting unit. When using the detection panel to detect the light-emitting unit, the loss rate of the light-emitting unit could be reduced and/or the time taken in detecting the light-emitting unit could be reduced.

A detection panel for detecting a light-emitting unit according to an embodiment of the disclosure includes a substrate and a plurality of detection units. The plurality of detection units are disposed on the substrate, wherein one of the plurality of detection units includes a first detection electrode and a second detection electrode, and there is a first specific distance between the first detection electrode and the second detection electrode. There is a second specific distance between the plurality of detection units and the corresponding light-emitting unit, and the plurality of detection units detect an electrical property generated after the light-emitting unit is illuminated with light to determine whether the light-emitting unit has defects or not.

The disclosure provides a detection device for detecting a light-emitting unit. When using the detection device to detect the light-emitting unit, the loss rate of the light-emitting unit and/or the time taken in detecting the light-emitting unit could be reduced.

A detection device for detecting the light-emitting unit according to an embodiment of the disclosure includes a detection panel, an optical unit and a control unit. The detection panel includes a substrate and a plurality of detection units. The plurality of detection units are disposed on the substrate, wherein one of the plurality of detection units includes a first detection electrode and a second detection electrode, and there is a first specific distance between the first detection electrode and the second detection electrode. The optical unit is configured to emit light to the light-emitting unit. The control unit is coupled to the detection panel. There is a second specific distance between the plurality of detection units and the corresponding light-emitting unit, and the control unit determines whether the light-emitting unit has defects or not in accordance with an electrical property generated after the light-emitting unit is illuminated with light and detected by the plurality of detection units.

Based on the above, the detection device provided by an embodiment of the disclosure uses a non-contact method to determine whether the detected light-emitting unit has defects or not. Therefore, the detection device could be used to detect relatively small-sized light-emitting units and/or a relatively large number of light-emitting units, so the effect of full inspection of the light-emitting units could be achieved, thereby improving the yield of subsequent products made by using the light-emitting units and/or reducing the time taken in detecting the light-emitting units. Furthermore, since the detection device provided by the disclosure detects the light-emitting unit in the non-contact method, the possibility of damage to the components in the light-emitting unit and/or the detection device could be reduced, and the yield of subsequent products made by using the light-emitting units could also be improved.

DESCRIPTION OF THE EMBODIMENTS

Figure 1:
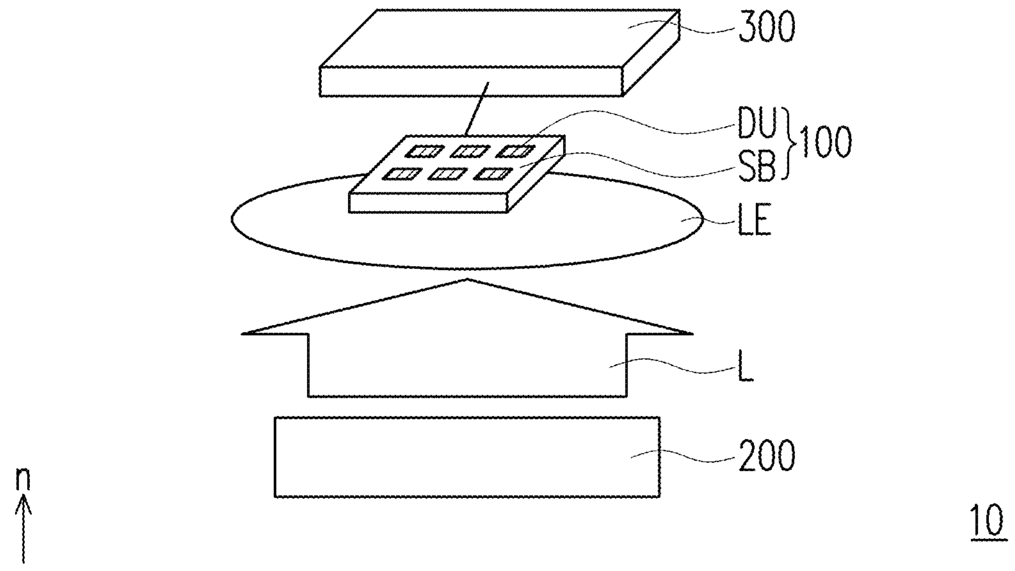
FIG. 1 is a schematic diagram of a detection device for detecting a light-emitting unit according to an embodiment of the disclosure.

The disclosure could be understood by referring to the following detailed description and combined with the accompanying drawings. It should be noted that, in order to make the readers easy to understand and the drawings to be concise, the drawings in the disclosure only depict part of the electronic devices, and certain elements in the drawings are not drawn to actual scale. In addition, the number of components and the size of components in the drawings are only for illustration and are not intended to limit the scope of the disclosure.

Directional terms (such as: "up", "down", "front", "back", "left", "right", etc.) mentioned in disclosure are only for reference to the directions of the accompanying drawings. Accordingly, the directional terms used are illustrative and not limiting of the disclosure. In the drawings, each illustrates the general features of methods, structures, and/or materials used in particular embodiments. However, these drawings should not be interpreted as defining or limiting the scope or nature encompassed by these embodiments. For example, the relative sizes, thicknesses, and locations of various layers, regions, and/or structures may be reduced or exaggerated for clarity.

The terms "approximately", "equal to", "equal" or "the same", "substantially" or "substantially" are generally interpreted to mean within 20% of a given value or range, or to mean within 10%, 5%, 3%, 2%, 1% or 0.5% of a given value or range.

It should be noted that in the following embodiments, features in several different embodiments could be replaced, reorganized, and mixed without departing from the spirit of the p disclosure to complete other embodiments. Features in various embodiments may be mixed and matched as long as they do not violate the spirit of the disclosure or conflict with each other.

The following are examples of exemplary embodiments of the disclosure. The same reference symbols are used in the drawings and descriptions to represent the same or similar parts.

Figure 2:
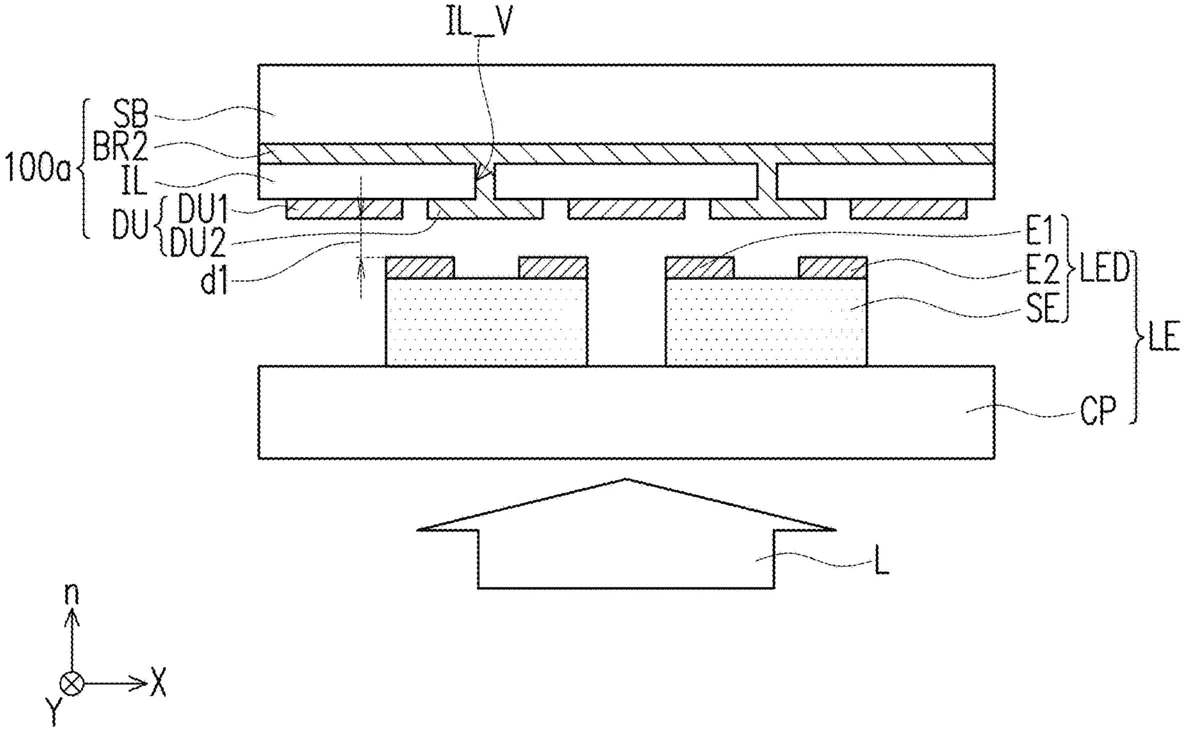
FIG. 2 is a partial cross-sectional schematic diagram of the arrangement relationship between the light-emitting unit and a detection panel according to the embodiment of FIG. 1.

FIG. 1 is a schematic diagram of a detection device for detecting a light-emitting unit according to an embodiment of the disclosure, and FIG. 2 is a partial cross-sectional schematic diagram of the arrangement relationship between the light-emitting unit and a detection panel according to the embodiment of FIG. 1.

Referring to FIG. 1 and FIG. 2 simultaneously, a detection device 10 for detecting a light-emitting unit LE in the present embodiment includes a detection panel 100, an optical unit 200 and a control unit 300, but the disclosure is not limited thereto. It is worth mentioning that the detection device 10 of the present embodiment is a detection device in a non-contact state. In detail, taking the detection panel 100*a* of an embodiment shown in FIG. 2 as an example, there is a specific distance d1 between the detection panel 100*a* in the detection device 10 and the light-emitting unit LE. In addition, the arrangement relationship between the detection panel 100 and the light emitting unit LE will be described in detail in the following embodiments.

In some embodiments, the light emitting unit LE could include a carrier plate CP and a plurality of light emitting diodes LED. For example, the carrier plate CP is used to carry the plurality of light emitting diodes LED. The carrier plate CP could be a wafer, but the disclosure is not limited thereto. The plurality of light emitting diodes LED are disposed on the carrier plate CP. In some embodiments, the plurality of light emitting diode LEDs could include micro LEDs, mini LEDs, or other suitable light emitting diodes. In the present embodiment, one of the plurality of light emitting diodes LED includes a semiconductor layer SE, a first electrode E1 and a second electrode E2. The semiconductor layer SE could include a first semiconductor layer (not shown), an active layer (not shown), and a second semiconductor layer (not shown), and the first semiconductor layer, the active layer, and the second semiconductor layer could be stacked in a normal direction n of the carrier plate CP in this sequence, but the disclosure is not limited thereto. The first electrode E1 is disposed on a surface of the semiconductor layer SE away from the carrier plate CP and is electrically connected to the first semiconductor layer in the semiconductor layer SE. The second electrode E2 is also disposed on the surface of the semiconductor layer SE away from the carrier late CP and is electrically connected to the second semiconductor layer in the semiconductor layer SE. Based on the above, the plurality of light-emitting diodes LED in the present embodiment could be horizontal light-emitting diodes, but the disclosure is not limited thereto. In other embodiments, the plurality of light-emitting diodes LED could be vertical light-emitting diodes, flip-chip light-emitting diodes, or other suitable light-emitting diodes.

In the present embodiment, the detection panel 100 includes a substrate SB and a plurality of detection units DU. The detection panel 100 could have the species of the detection panel 100*a*, the detection panel 100*b* and the detection panel 100*c* described in the following embodiments; however, the disclosure is not limited to these species.

A material of the substrate SB could be glass, plastic or a combination thereof. For example, the material of the substrate SB could include quartz, sapphire, silicon (Si), germanium (Ge), silicon carbide (SiC), gallium nitride (GaN), silicon germanium (SiGe), poly(methyl methacrylate) (PMMA), polycarbonate (PC), polyimide (PI), polyethylene terephthalate (PET) or other suitable materials or a combination thereof, but the disclosure is not limited thereto.

The plurality of detection units DU are disposed on the substrate SB and face the light emitting unit LE. In the present embodiment, the plurality of detection units DU could detect the electrical properties generated by the light-emitting unit LE after being illuminated with light to determine whether the light-emitting unit LE has defects or not, which will be described in detail in the following embodiments.

In the present embodiment, the detection panel 100*a* further includes an insulating layer IL. The insulating layer IL is disposed between the plurality of detection units DU and the substrate SB, but the disclosure is not limited thereto. A material of the insulating layer IL could include inorganic materials (such as silicon oxide, silicon nitride, silicon oxynitride or a stacked layer of at least two of the above materials), but the disclosure is not limited thereto. In the present embodiment, the insulating layer IL includes a through hole IL_V, wherein the second electrode E2 could be electrically connected to corresponding second bridge part BR2 through the through hole IL_V. The technical solution of the second bridge part BR2 will be described in detail in the following embodiments.

Figure 3A:
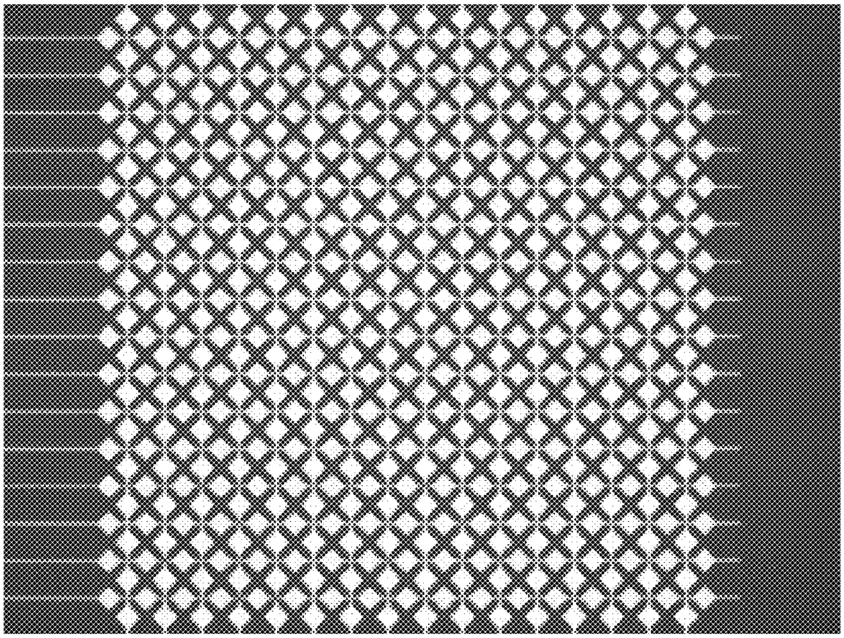
FIG. 3A to FIG. 3D each shows a partial top view of shapes of a first detection electrode and a second detection electrode in a detection unit according to some embodiments of FIG. 1.
Figure 3B:
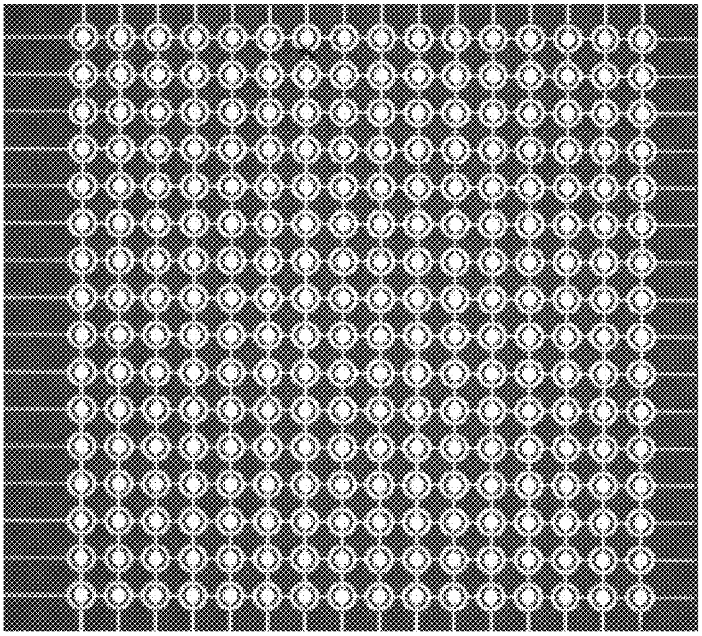
Figure 3C:
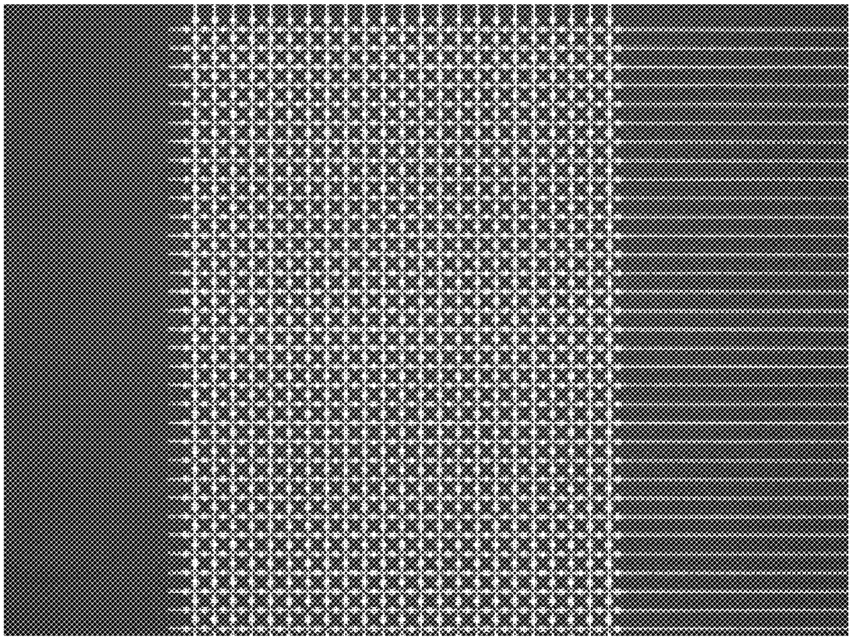
Figure 3D:
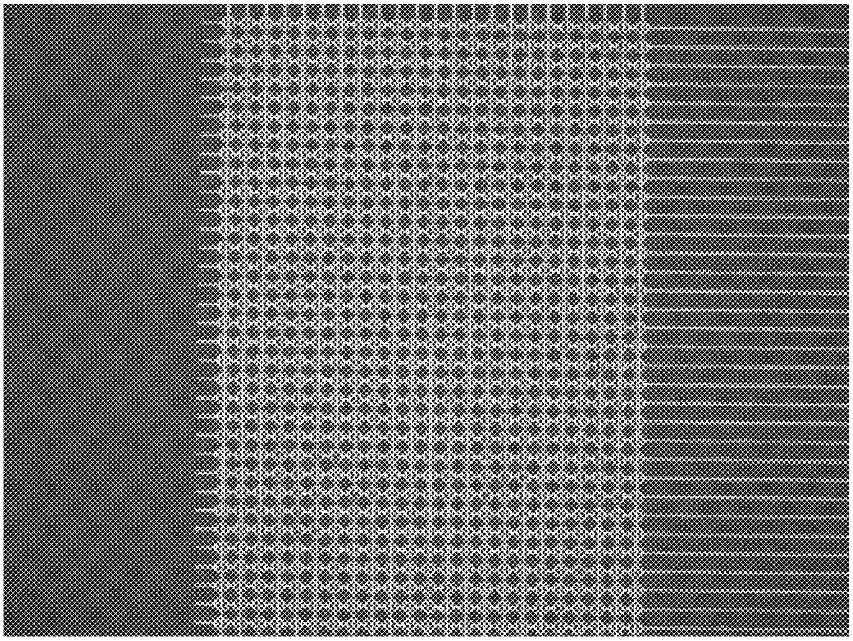
Figure 3E:
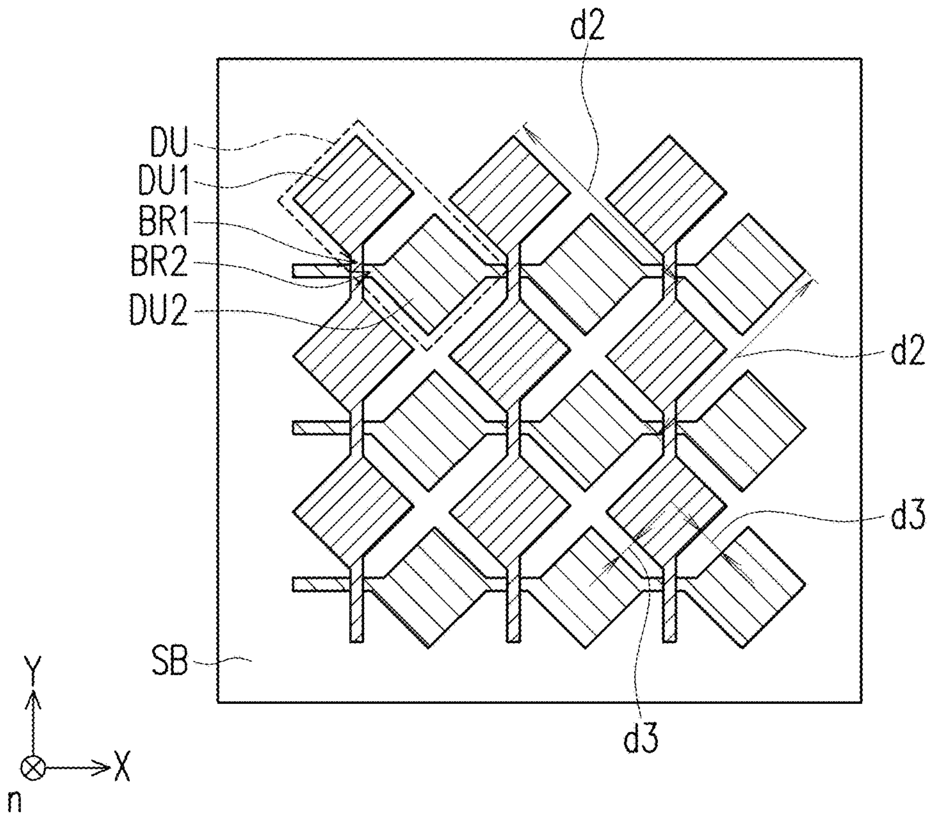
FIG. 3E and FIG. 3F each shows a partial enlarged schematic diagram of the shapes of the first detection electrode and the second detection electrode in FIG. 3A and FIG. 3B.
Figure 3F:
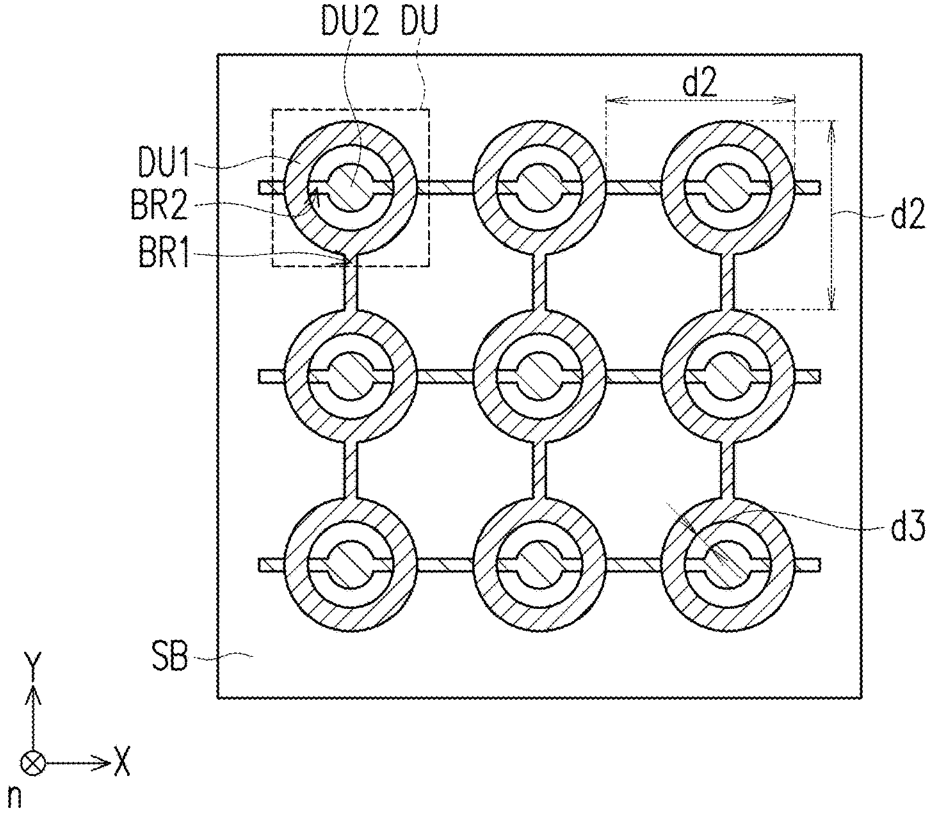

FIG. 3A to FIG. 3D each shows a partial top view of shapes of a first detection electrode and a second detection electrode in a detection unit according to some embodiments of FIG. 1, and FIG. 3E and FIG. 3F each shows a partial enlarged schematic diagram of the shapes of the first detection electrode and the second detection electrode in FIG. 3A and FIG. 3B.

Referring to FIGS. 3A to 3D, in the present embodiment, the plurality of detection units DU are disposed on the substrate SB in an array. Specifically, taking the enlarged schematic diagrams shown in FIG. 3E and FIG. 3F as an example, there is a specific distance d2 between the adjacent detection units DU disposed on the substrate SB in the first direction X and the second direction Y; however, the disclosure is not limited thereto. In some embodiments, the specific distance d2 between adjacent detection units DU in the first direction X and the specific distance d2 between adjacent detection units DU in the second direction Y could be the same or different from each other, but the disclosure is not limited thereto. In some embodiments, the first direction X could be perpendicular to the second direction Y, and the first direction X and the second direction Y could be perpendicular to the normal direction n of the carrier plate CP, but the disclosure is not limited thereto.

In the present embodiment, one of the plurality of detection units DU includes a first detection electrode DU1 and a second detection electrode DU2. There is a specific distance d3 between the first detection electrode DU1 and the second detection electrode DU2, so that the first detection electrode DU1 and the second detection electrode DU2 are electrically isolated from each other. In the present embodiment, the specific distance d3 between the first detection electrode DU1 and the second detection electrode DU2 is 2% to 30% of the specific distance d2 between the adjacent detection units DU. When the specific distance d3 and the specific distance d2 meet the above relationship, the detection unit DU could have a better sensing effect. The first detection electrode DU1 and the second detection electrode DU2 could each include a suitable metal material, and the disclosure is not limited thereto.

In some embodiments, the first detection electrode DU1 and the second detection electrode DU2 present the shape of geometric pattern in a normal direction of the substrate SB (which is opposite to the normal direction n of the carrier plate CP). In detail, the shape of the first detection electrode DU1 and the shape of the second detection electrode DU2 in the normal direction of the substrate SB could include a rectangle, a rhombus, a circle, a ring or a combination thereof, but the disclosure is not limited thereto. For example, FIG. 3A and FIG. 3E show that the first detection electrode DU1 and the second detection electrode DU2 could include the rhombus in the normal direction of the substrate SB. FIG. 3B and FIG. 3F show that the first detection electrode DU1 and the second detection electrode DU2 could each include the ring and the circle in the normal direction of the substrate SB, in which the first detection electrode DU1 surrounds the second detection electrode DU2. FIG. 3C is a modification of FIG. 3A, which shows the first detection electrode DU1 and the second detection electrode DU2 could include relatively small rhombus patterns in the normal direction of the substrate SB. FIG. 3D is a modification of FIG. 3B, which shows the first detection electrode DU1 and the second detection electrode DU2 could each include the ring and the rectangle in the normal direction of the substrate SB, in which the first detection electrode DU1 surrounds the second detection electrode DU2.

Figure 3G:
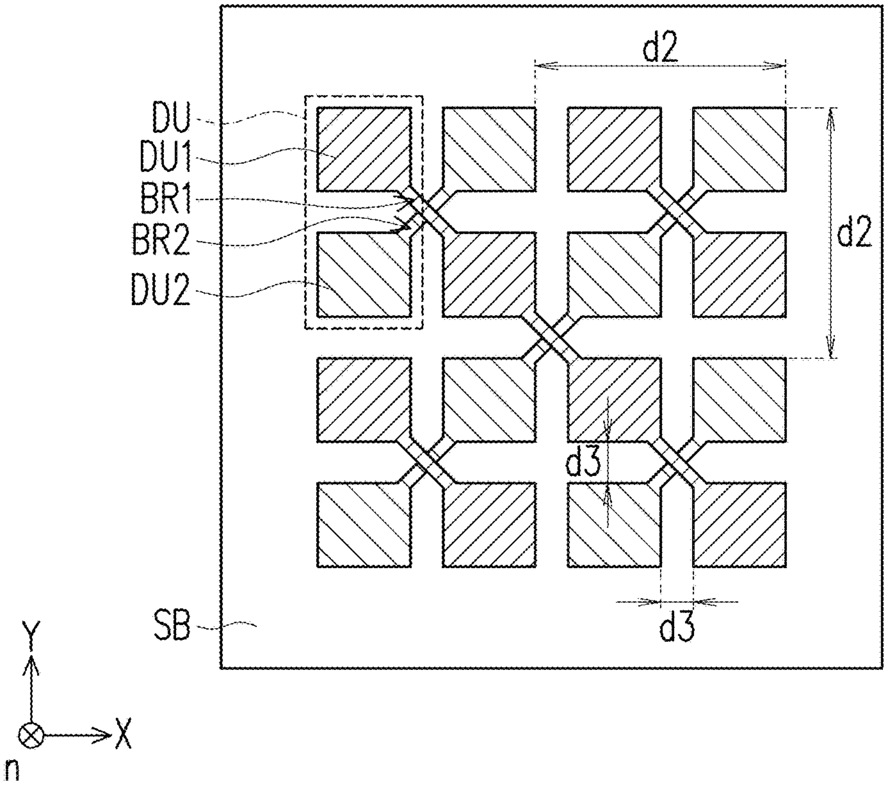
FIG. 3G and FIG. 3H each shows a partial enlarged schematic diagram of the shapes of the first detection electrode and the second detection electrode in the detection unit according to other embodiments of FIG. 1.
Figure 3H:
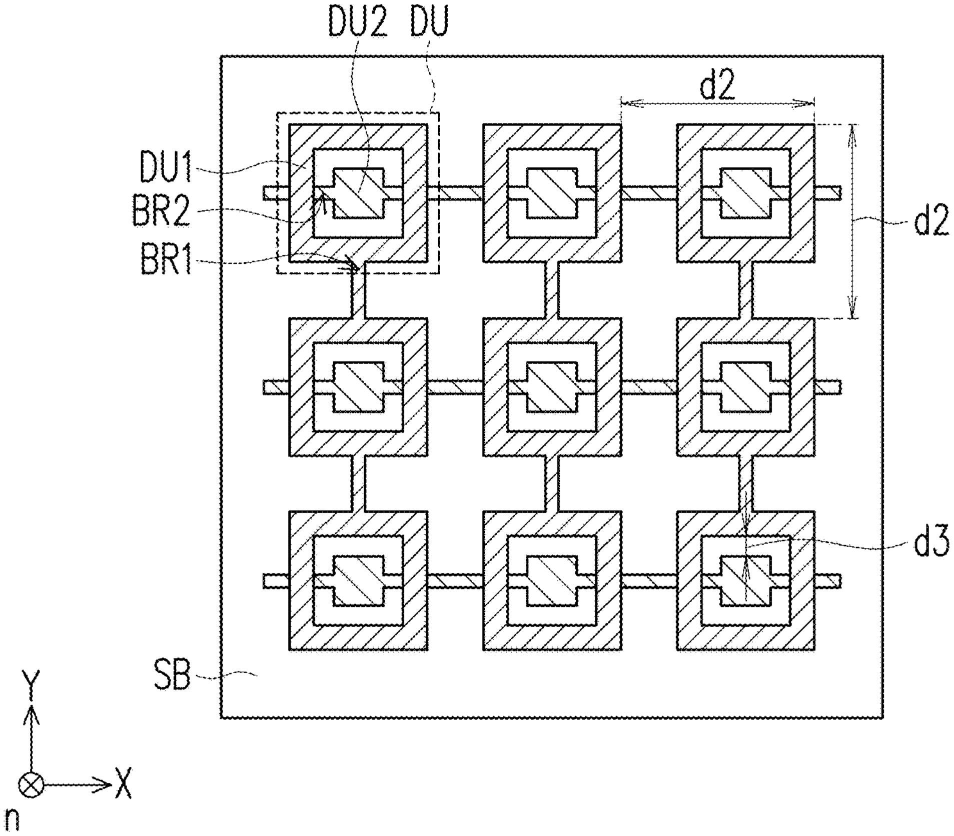

In other embodiments, the first detection electrode DU1 and the second detection electrode DU2 could also have other shapes. Referring to FIG. 3G and FIG. 3H, FIG. 3G shows that the first detection electrode DU1 and the second detection electrode DU2 could include the rectangle in the normal direction of the substrate SB, and FIG. 3H shows that the first detection electrode DU1 and the second detection electrode DU2 could each include a square ring and the rectangle in the normal direction of the substrate SB, wherein the first detection electrode DU1 surrounds the second detection electrode DU2.

As mentioned above, in the present embodiment, there is the specific distance d1 between the plurality of detection units DU and the corresponding light-emitting unit LE, and the first detection electrode DU1 and the second detection electrode DU2 in the plurality of detection units DU each corresponds to the first electrode E1 and the second electrode E2. The detection panel 100*a* could detect the electrical properties of the light-emitting unit LE after being illuminated with light through the plurality of detection units DU to determine whether the light-emitting unit LE has defects or not. In detail, in the present embodiment, the optical unit 200 could be used to emit light to the light-emitting unit LE, so that the light-emitting unit LE generates a photovoltaic effect. Namely, the light-emitting unit LE would absorb the light, so the charge distribution on the first electrode E1 and the second electrode E2 are changed, thereby generating an electric field (or potential difference) between the first electrode E1 and the second electrode E2. Based on the above, the first detection electrode DU1 and the second detection electrode DU2 could each detect the potential of the first electrode E1 and the potential of the second electrode E2 and/or the electric field generated between the first electrode E1 and the second electrode E2 (or potential difference), causing the capacitance value of the corresponding detection unit DU to change, and whether the light-emitting unit LE has a defect or not could be determined based on the change in the capacitance value. It is worth mentioned that the first detection electrode DU1 and the second detection electrode DU2 respectively correspond to the first electrode E1 and the second electrode E2 could mean that the first detection electrode DU1 partially overlaps the first electrode E1 in the normal direction n pf the carrier plate CP at least; and the second detection electrode DU2 partially overlaps the second electrode E2 in the normal direction n pf the carrier plate CP at least, but the disclosure is not limited thereto.

Referring to FIGS. 3A to 3H, which illustrate the shape and arrangement relationship of the first detection electrode DU1 and the second detection electrode DU2 in the detection unit DU of the detection panel 100 of FIG. 1. In the present embodiment, the detection panel 100 further includes a plurality of first bridge parts BR1 and a plurality of second bridge parts BR2. The first bridge part BR1 is disposed between adjacent first detection electrodes DU1, so that the plurality of first detection electrodes DU1 could be electrically connected to each other. Similarly, the second bridge part BR2 is disposed between adjacent second detection electrodes DU2, so that the plurality of second detection electrodes DU2 could be electrically connected to each other. A material of the first bridge part BR1 could be the same or similar to the material of the first detection electrode DU1, and a material of the second bridge part BR2 could be the same or similar to the material of the second detection electrode DU2, the disclosure is not limited thereto.

Figure 4A:
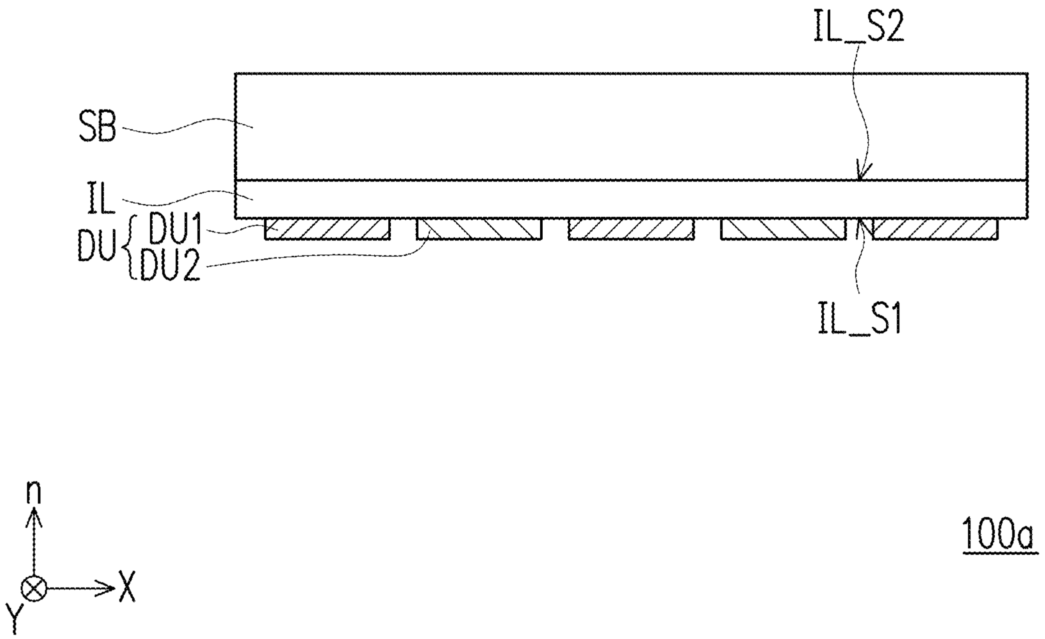
FIG. 4A is a partial cross-sectional schematic diagram of the arrangement relationship between the first detection electrode and the second detection electrode in the detection unit according to the embodiment of FIG. 2.
Figure 4B:
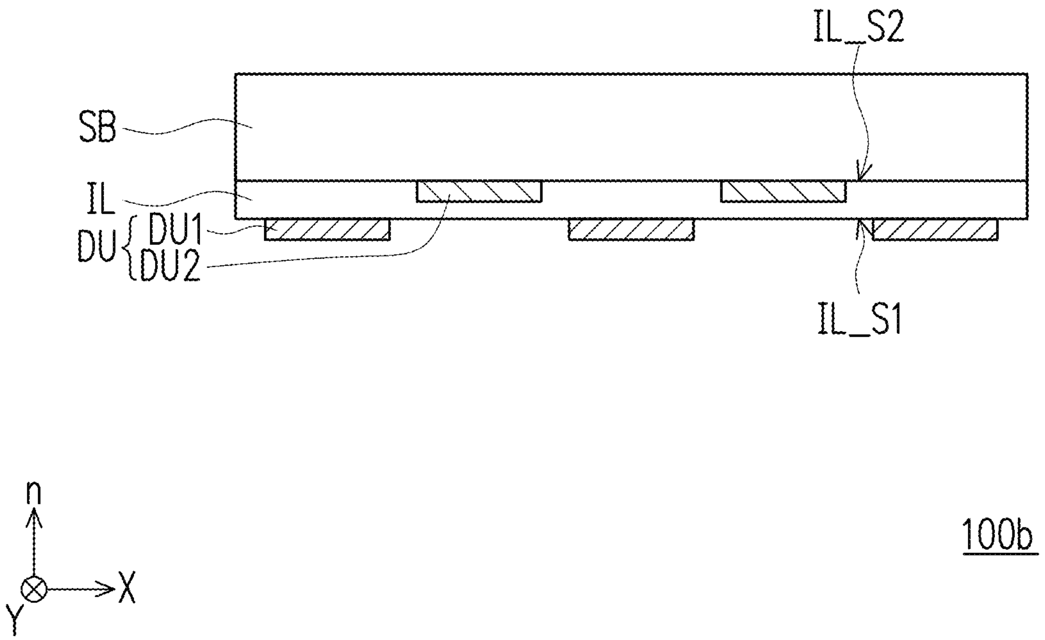
FIG. 4B is a partial cross-sectional schematic diagram of the arrangement relationship between the first detection electrode and the second detection electrode in the detection unit according to another embodiment of FIG. 2.

FIG. 4A is a partial cross-sectional schematic diagram of the arrangement relationship between the first detection electrode and the second detection electrode in the detection unit according to the embodiment of FIG. 2, and FIG. 4B is a partial cross-sectional schematic diagram of the arrangement relationship between the first detection electrode and the second detection electrode in the detection unit according to another embodiment of FIG. 2.

In some embodiments, the first detection electrode DU1 and the second detection electrode DU2 in the detection unit DU could be coplanar with each other. Specifically, as shown in FIG. 4A, the first detection electrode DU1 and the second detection electrode DU2 are both disposed on a surface IL_S1 of the insulating layer IL away from the substrate SB, so that the first detection electrode DU1 and the second detection electrode DU2 are substantially located at the same horizontal level, but the disclosure is not limited thereto. In other embodiments, the first detection electrode DU1 and the second detection electrode DU2 in the detection unit DU could not be coplanar with each other. Specifically, as shown in FIG. 4B, the first detection electrode DU1 is disposed on the surface IL_S1 of the insulating layer IL away from the substrate SB, and the second detection electrode DU2 is disposed on a surface IL_S2 of the insulating layer IL closer to the substrate SB, so that the first detection electrode DU1 and the second detection electrode DU2 are located at different horizontal levels to increase the detection area of the first detection electrode DU1 and/or the detection area of the second detection electrode DU2. In detail, the first detection electrode DU1 could partially overlap the second detection electrode DU2 at least in which they are not coplanar to each other, so that the detection area of the first detection electrode DU1 and/or the detection area of the second detection electrode DU2 could be increased, but the disclosure is not limited thereto.

Figure 4C:
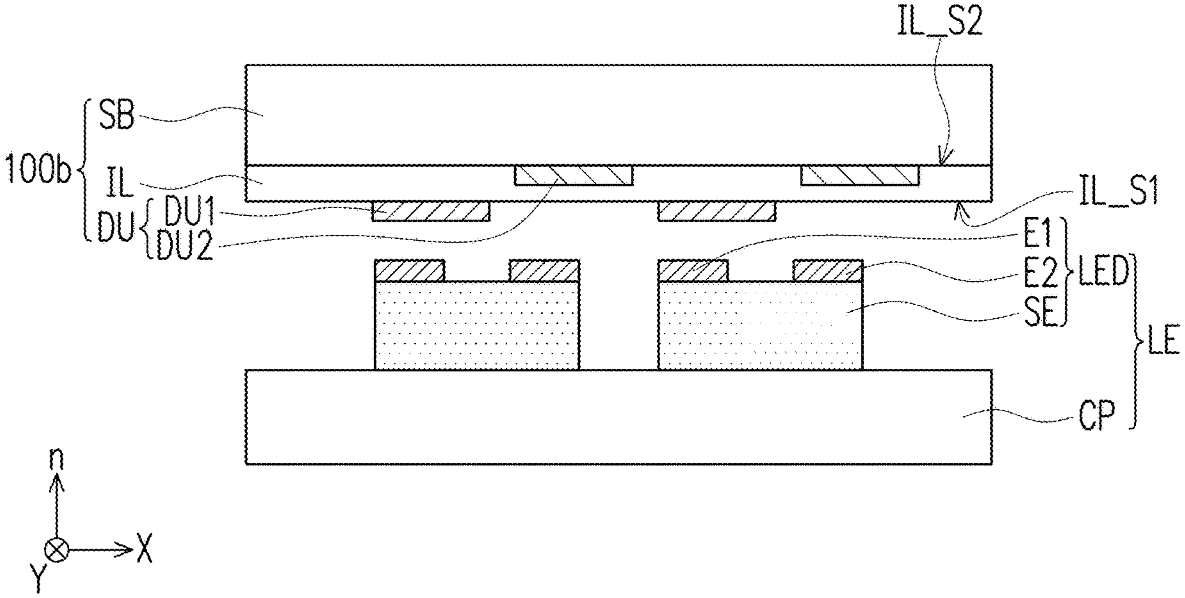
FIG. 4C is a partial cross-sectional schematic diagram of the arrangement relationship between the detection unit and the light-emitting unit according to the embodiment of FIG. 1.
Figure 4D:
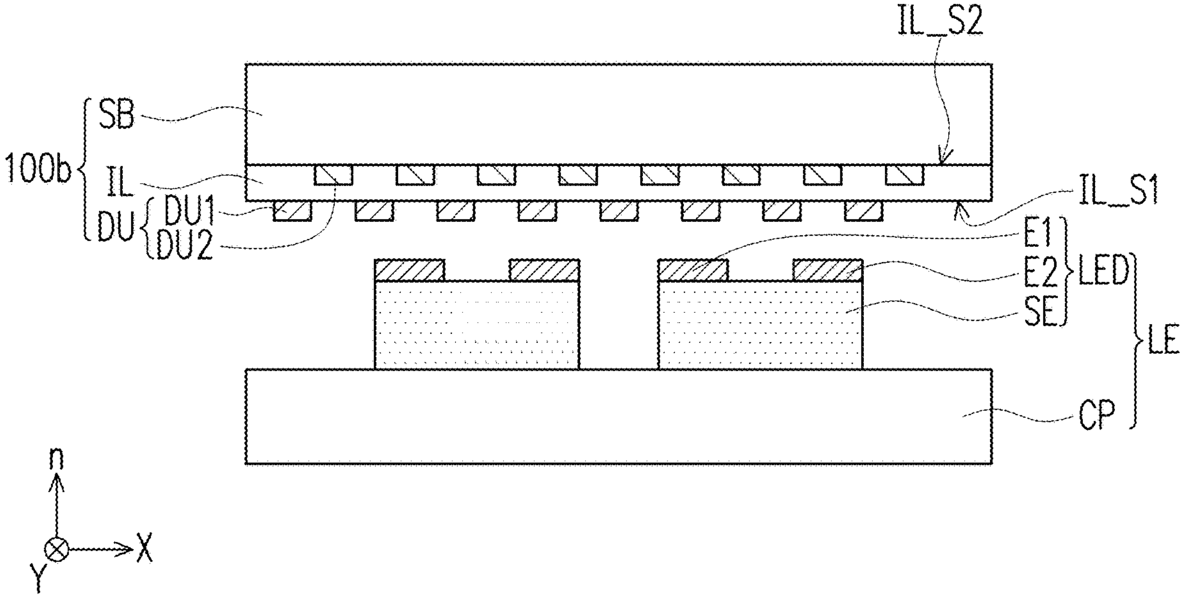
FIG. 4D is a partial cross-sectional schematic diagram of the arrangement relationship between the detection unit and the light-emitting unit according to another embodiment of FIG. 1.

FIG. 4C is a partial cross-sectional schematic diagram of the arrangement relationship between the detection unit and the light-emitting unit according to the embodiment of FIG. 1, and FIG. 4D is a partial cross-sectional schematic diagram of the arrangement relationship between the detection unit and the light-emitting unit according to another embodiment of FIG. 1.

In some embodiments, one of the plurality of detection units DU corresponds to one light emitting unit LE. In detail, as shown in FIG. 4C, the first detection electrode DU1 in one detection unit DU corresponds to the first electrode E1 in one light-emitting unit LE, and the second detection electrode DU2 in one detection unit DU corresponds to the second electrode E2 in one light-emitting unit LE, but the disclosure is not limited thereto. In other embodiments, at least two of the plurality of detection units DU correspond to one light-emitting unit LE. In detail, as shown in FIG. 4D, the first detection electrode DU1 in at least three detection units DU corresponds to the first electrode E1 in one light-emitting unit LE, and the second detection electrode DU2 in at least three detection units DU corresponds to the second electrode E2 in the light-emitting unit LE, so as to improve the accuracy of the detected electrical properties of the light-emitting unit LE.

Continuing to refer to FIG. 1, the optical unit 200 is disposed below the light-emitting unit LE for emitting light L to the light-emitting unit LE in the normal direction n of the carrier plate CP, but the disclosure is not limited thereto. In other embodiments, the optical unit 200 could be disposed on a side of the light-emitting unit LE for emitting light L to the light-emitting unit LE in the first direction X or the second direction Y or in other directions.

The optical unit 200 could include a light source (not shown), wherein the light source could include a laser unit, a light emitting diode, a mercury vapor lamp or other suitable light sources, but the disclosure is not limited thereto. Based on the above, the optical unit 200 could be used to emit the light L. In the present embodiment, the optical unit 200 could simultaneously emit the light L to the plurality of light-emitting diodes LED, and the illuminance of the light L illuminating each light-emitting diode LED could be substantially equal, but the disclosure is not limited thereto. The light L emitted by the optical unit 200 could cause the light-emitting unit LE to generate the photovoltaic effect. Therefore, the wavelength of the light L is smaller than the wavelength of light emitted by the light-emitting diodes LED, but the disclosure is not limited thereto.

In the present embodiment, the light-emitting unit LE is emitted by the light L through the optical unit 200, and the semiconductor layer SE in the light-emitting unit LE absorbs the photons in the light L to generate electrons, so that the charge distribution on the first electrode E1 and the second electrode E2 could be changed, thereby generating an electric field (or potential difference) between the first electrode E1 and the second electrode E2. Based on the above, the first detection electrode DU1 and the second detection electrode DU2 could each detect the potential of the first electrode E1 and the potential of the second electrode E2 and/or the electric field generated between the first electrode E1 and the second electrode E2 (or potential difference), causing the capacitance value of the corresponding detection unit DU to change, and whether the light-emitting unit LE has a defect or not could be determined based on the change in the capacitance value.

The control unit 300 is coupled to the detection panel 100*a*. The control unit 300 could include a processing unit (not shown) and a memory unit (not shown), and the processing unit could be used to process signals provided from the detection panel 100*a*. The memory unit could be used to store the above signals provided from the detection panel 100*a* and/or the signals processed by the processing unit. In the present embodiment, the control unit 300 could determine whether the capacitance value of each detection unit DU in the detection panel 100*a* is lower than a preset capacitance value or not. In detail, the preset capacitance value of the detection unit DU could be stored in the memory unit of the control unit 300, and the electrical properties of the plurality of light-emitting diodes LED could be obtained by comparing the changed capacitance value of each detection unit DU in the detection panel 100*a* and the preset capacitance value, so as to determine whether each light-emitting diodes LED in the light-emitting unit LE has defects or not.

For example, in the present embodiment, after the optical unit 200 emits the light L to the light-emitting unit LE, the light-emitting unit LE could generate the photovoltaic effect when the light-emitting unit LE is in a normal working state, so that the electric field or the potential difference could be generated between the first electrode E1 and the second electrode E2 of the light-emitting diodes LED. After that, the capacitance values of the plurality of detection units DU in the detection panel 100*a* could be changed due to the electric field (or the potential difference) generated by the corresponding light-emitting diodes LED, and the light-emitting unit LE could be determined to be a normal light-emitting unit in accordance with the capacitance values of the detection units DU higher than the preset capacitance value. In contrast, when the light-emitting unit LE is in an abnormal working state, the electric field and/or the potential difference would not be generated between the first electrode E1 and the second electrode E2 of the light-emitting unit LE, so that the capacitance values of the corresponding detection unit DU would not be changed, and the light-emitting unit LE could be determined to be a defective light-emitting unit in accordance with the capacitance values of the detection units DU lower than the preset capacitance value.

In some embodiments, the detection device 10 could further include a detection platform (not shown), wherein the detection panel 100*a* could be disposed on a moving axis (not shown) of the detection platform, and the light emitting unit LE could be disposed on a moving platform (not shown) of the detection platform. When the detection device 10 is used to detect the light-emitting unit LE, the light-emitting unit LE could be horizontally moved in the first direction X and/or the second direction Y through the moving platform of the detection platform, and the detection panel 100*a* could be vertically moved to be close to the light emitting unit LE through the moving axis of the detection platform, but the disclosure is not limited thereto.

Based on the above, the detection device 10 for detecting the light-emitting unit LE in the present embodiment uses a non-contact method to determine whether the light-emitting unit LE has defects or not. Therefore, the detection device 10 could be used to detect relatively small-sized light-emitting units LE and/or a relatively large number of light-emitting units LE s, so the effect of full inspection of the light-emitting units could be achieved, thereby improving the yield of subsequent products made by using the light-emitting units LE and/or reducing the time taken in detecting the light-emitting units LE. Furthermore, since the detection device 10 detects the light-emitting unit in the non-contact method, the possibility of damage to the first electrode E1 and the second electrode E2 of the light-emitting unit LE and/or the detection device 10 could be reduced, and the yield of subsequent products made by using the light-emitting units LE could also be improved.

Figure 5:
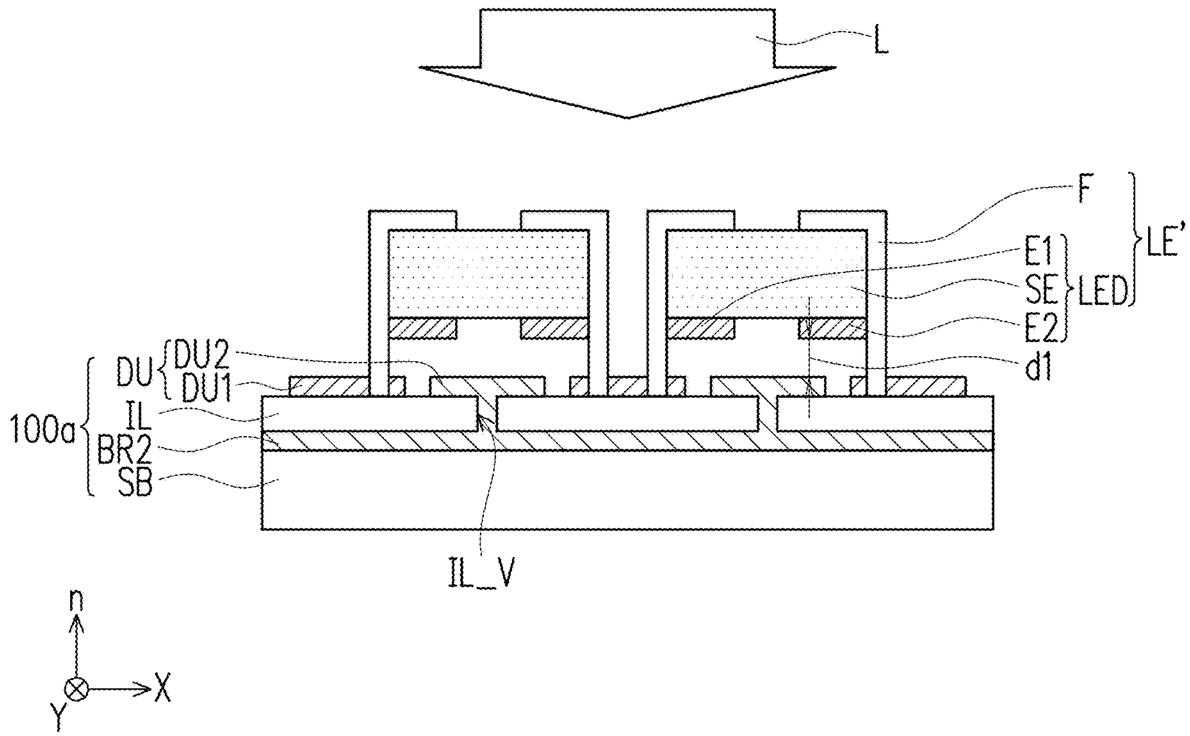
FIG. 5 is a partial cross-sectional schematic diagram of the arrangement relationship between the light-emitting unit and the detection panel according to another embodiment of FIG. 1.

FIG. 5 is a partial cross-sectional schematic diagram of the arrangement relationship between the light-emitting unit and the detection panel according to another embodiment of FIG. 1. It should be noted that the reference numbers and the contents in embodiment of FIG. 5 could use that in the embodiments of FIG. 1 and FIG. 2, wherein the same or similar reference numbers are used to represent the same or similar components, and descriptions of the same technical content are omitted.

Referring to FIG. 5, in the present embodiment, the light emitting unit LE' is disposed on the detection panel 100*a*. In detail, the light-emitting unit LE' further includes a fixed member F, wherein the plurality of light-emitting diodes LED are disposed on the detection panel 100*a* by using the fixed member F. In the present embodiment, one end of the fixing member F is disposed on the insulating layer IL of the detection panel 100*a*, and the other end of the fixing member F is disposed on the semiconductor layer SE of the light-emitting unit LE' to support the light-emitting unit LE'. Based on the above, in the present embodiment, the fixing member F could be used to maintain the specific distance d1 between the detection unit DU and the corresponding light-emitting diode LED, so as to achieve the effect of non-contact detection on the light-emitting diode LED. In some embodiments, the fixing member F includes an anchor structure, but the disclosure is not limited thereto.

Figure 6:
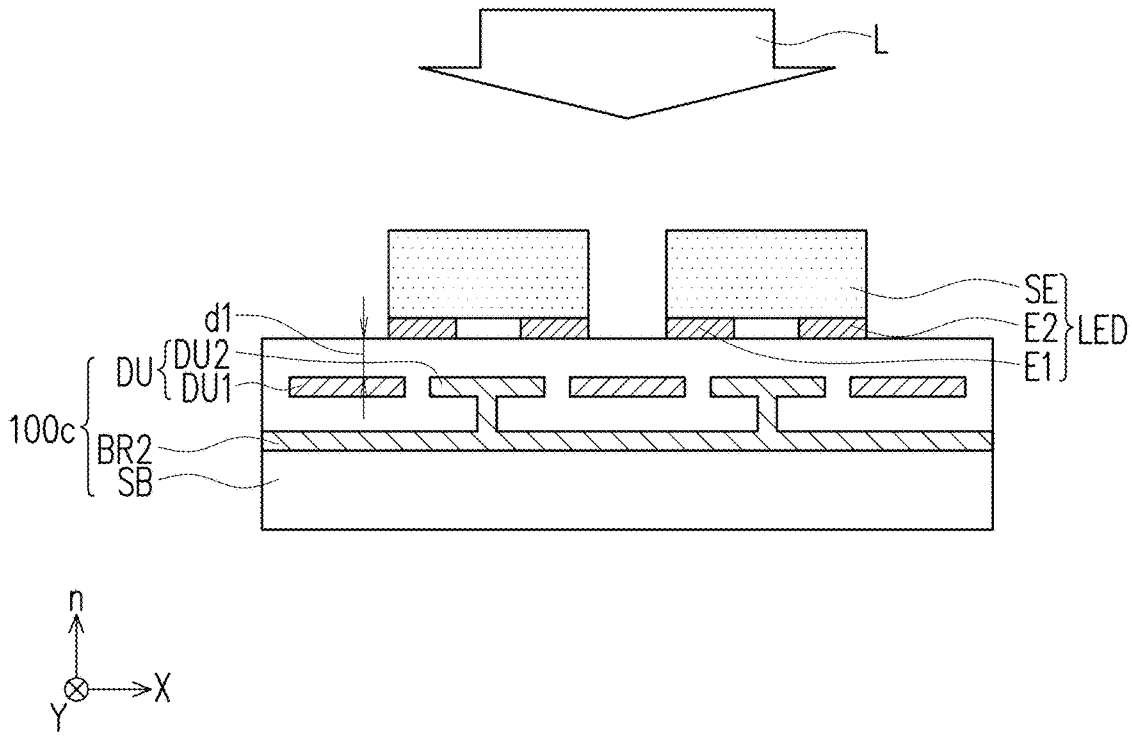
FIG. 6 is a partial cross-sectional schematic diagram of the arrangement relationship between the light-emitting unit and the detection panel according to yet another embodiment of FIG. 1.

FIG. 6 is a partial cross-sectional schematic diagram of the arrangement relationship between the light-emitting unit and the detection panel according to yet another embodiment of FIG. 1. It should be noted that the reference numbers and the contents in embodiment of FIG. 6 could use that in the embodiments of FIG. 1 and FIG. 2, wherein the same or similar reference numbers are used to represent the same or similar components, and descriptions of the same technical content are omitted.

Referring to FIG. 6, in the present embodiment, the detection device 10 includes a detection panel 100*c*, in which the detection unit DU of the detection panel 100*c* is embedded in the substrate SB. Based on the above, the light-emitting diode LED could be disposed on the substrate SB of the detection panel 100*c* in a flip-chip manner, and the specific distance d1 is still maintained between the detection unit DU and the corresponding light-emitting diode LED, so as to achieve the effect of non-contact detection on the light-emitting diode LED.

EXPERIMENTAL EXAMPLE

The disclosure would be explained below through the experimental example, but the experimental example is only for illustration and is not intended to limit the scope of the disclosure.

Figure 7:
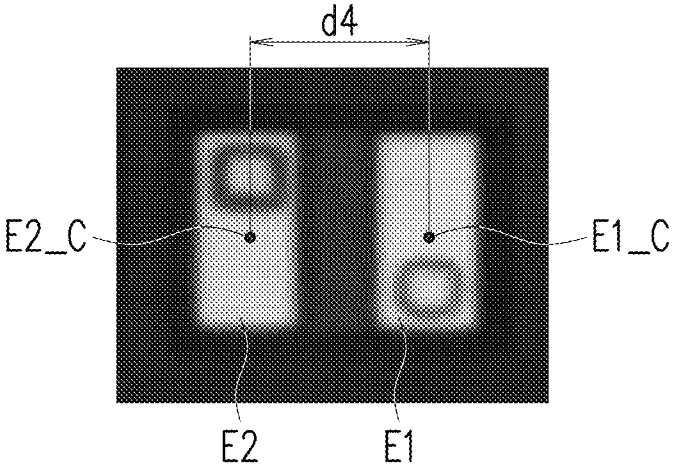
FIG. 7 shows an optical microscope image of a light-emitting diode according to the embodiment of FIG. 1.

In the experimental example, the detection device 10 is used to conduct non-contact detection on the light-emitting diode LED, wherein the detected light-emitting diode LED is shown in FIG. 7. It is worth noting that FIG. 7 only shows the first electrode E1 and the second electrode E2 in the light-emitting diode LED, and the other components could be known by referring to the above embodiments and would be omitted.

Embodiment 1

In the present embodiment, the detection device 10 is used to detect the potential of the first electrode E1 and the potential of the second electrode E2, wherein the detection method is to measure the potential on a connecting path from a center E2_C of the second electrode E2 to a center E1_C of the first electrode E1. In the present experimental example, a specific distance d4 between the center E2_C of the second electrode E2 and the center E1_C of the first electrode E1 is 70 μm, but the disclosure is not limited thereto.

Figure 8A:
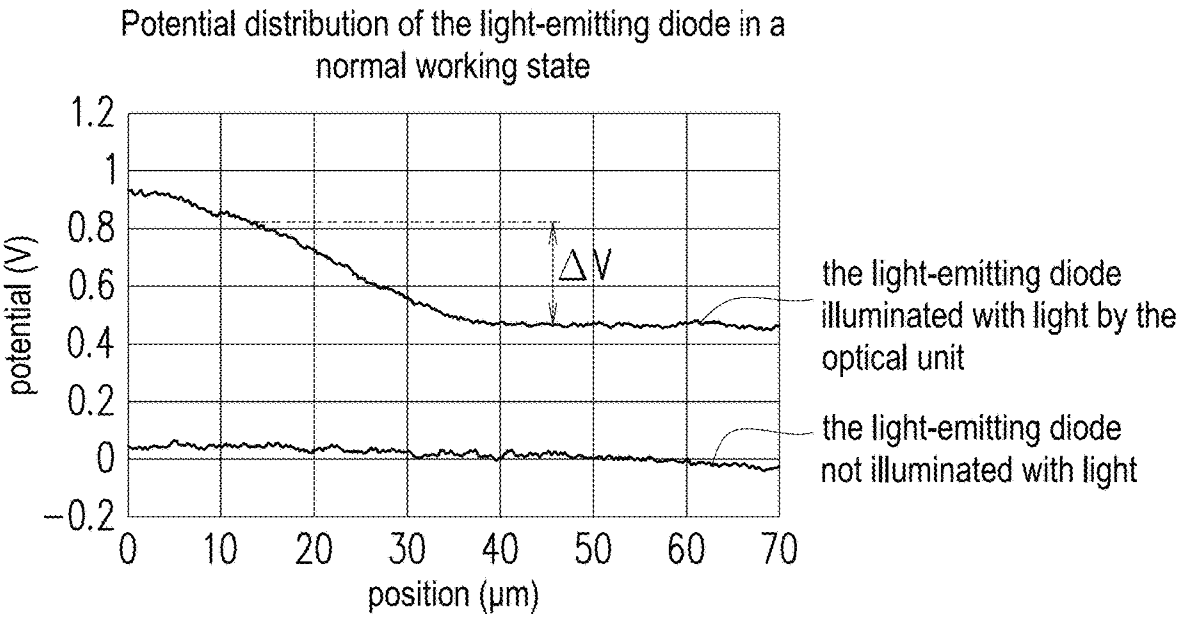
FIG. 8A is a curve graph showing the relationship between a potential of a light-emitting diode and a position of the light-emitting diode in a normal working state before being illuminated with light and after being illuminated with light.
Figure 8B:
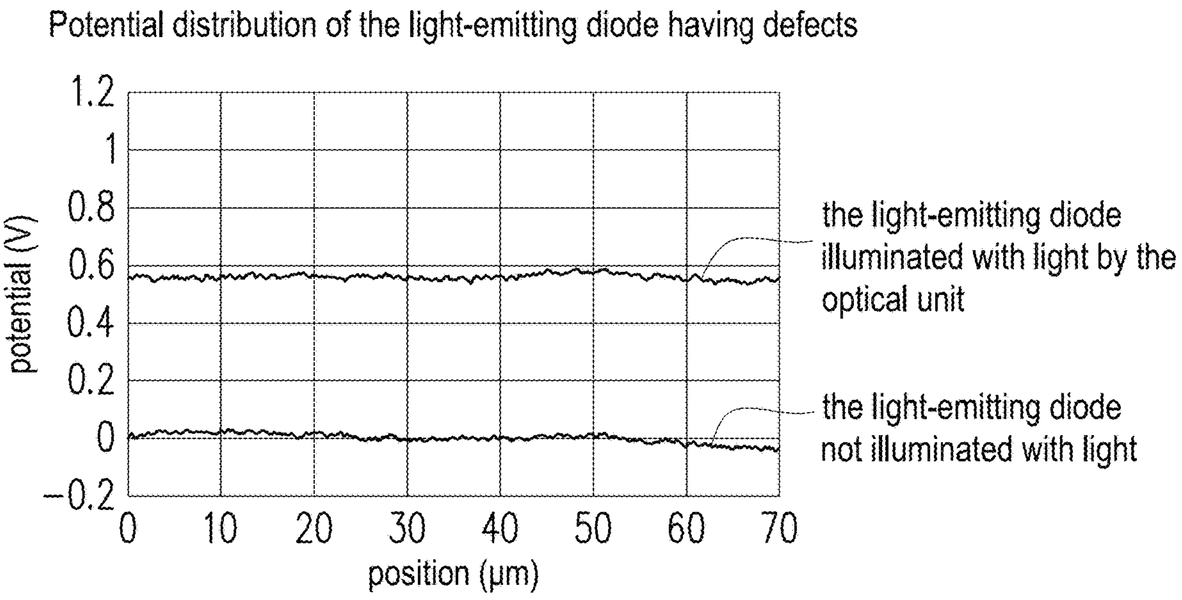
FIG. 8B is a curve graph showing the relationship between a potential of a light-emitting diode having defects and a position of the light-emitting diode having defects before being illuminated with light and after being illuminated with light.

FIG. 8A and FIG. 8B each shows the electrical properties of the light-emitting diode in the normal working state and the light-emitting diode having defects, in which the position of the center E2_C of the second electrode E2 on the X-axis is regarded as 0 μm, and the position of the center E1_C of the first electrode E1 on the X-axis is regarded as 70 μm.

It could be seen from FIG. 8A that after the light-emitting diode is illuminated with light, the potential difference ΔV of approximately 0.4 V would be generated between the first electrode E1 and the second electrode E2 when the light-emitting diode is in the normal working state. In contrast, it could be seen from FIG. 8B that after the light-emitting diode is illuminated with light, there would be no potential difference between the first electrode E1 and the second electrode E2 when the light-emitting diode having defects.

Embodiment 2

In the present embodiment, the detection device 10 is used to detect eight light-emitting diodes, wherein the structure of the eight light-emitting diodes is the same as the structure of the detected light-emitting diodes in Embodiment 1.

Figure 9:
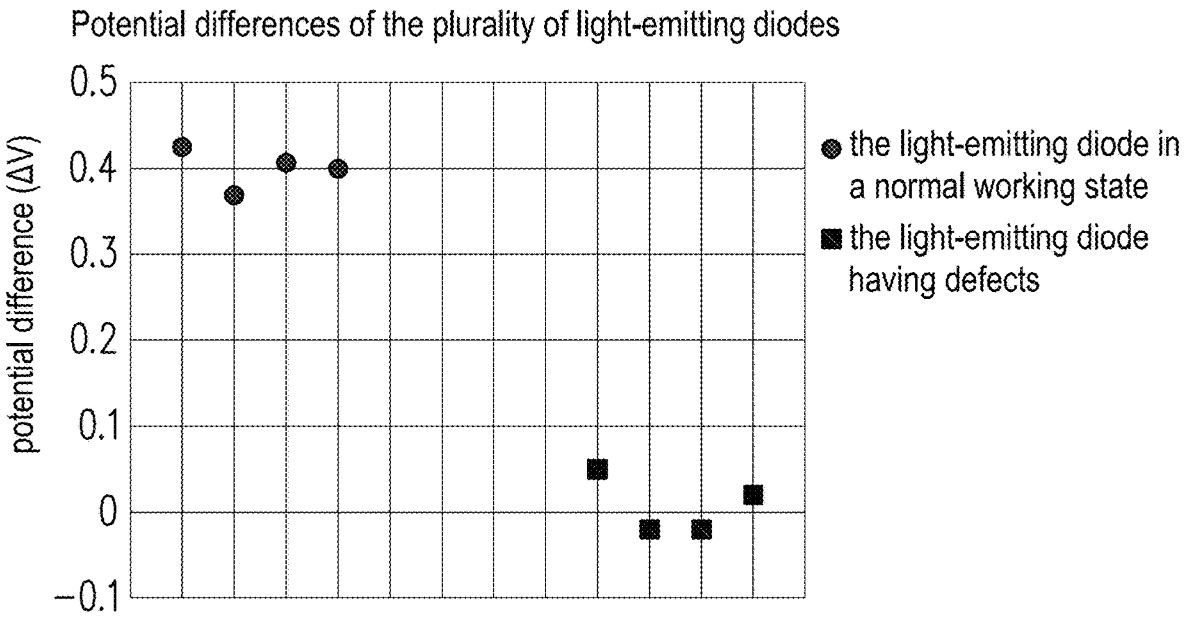
FIG. 9 is a graph of potential difference of eight light-emitting diodes after being illuminated with light.

Referring to FIG. 9, FIG. 9 shows the performance of the potential difference of eight light-emitting diodes after being illuminated with light. It could be seen that there are the potential difference ΔV of approximately 0.4 V generated between the first electrode E1 and the second electrode E2 in the four light-emitting diodes, and there are no potential difference generated between the first electrode E1 and the second electrode E2 in the other four light-emitting diodes. Based on the above, it could be determined that the four light-emitting diodes failing to generate the potential difference have defects in accordance with the performance of the potential of the above eight light-emitting diodes after being illuminated with light.

In summary, the detection device provided by the disclosure uses a non-contact method to determine whether the detected light-emitting unit has defects or not. Therefore, the detection device could be used to detect relatively small-sized light-emitting units and/or a relatively large number of light-emitting units, so the effect of full inspection of the light-emitting units could be achieved, thereby improving the yield of subsequent products made by using the light-emitting units and/or reducing the time taken in detecting the light-emitting units. Furthermore, since the detection device provided by the disclosure detects the light-emitting unit in the non-contact method, the possibility of damage to the first electrode and the second electrode in the light-emitting unit and/or the detection device could be reduced, and the yield of subsequent products made by using the light-emitting units could also be improved.

What is claimed is:

1. A detection panel for detecting a light-emitting unit, including:

a substrate;

a plurality of detection units, disposed on the substrate, wherein one of the plurality of detection units includes a first detection electrode and a second detection electrode, and there is a first specific distance between the first detection electrode and the second detection electrode; and a plurality of first bridge parts and a plurality of second bridge parts, wherein the adjacent first detection electrodes are electrically connected to each other through one of the plurality of first bridge parts, and the adjacent second detection electrodes are electrically connected to each other through one of the plurality of second bridge parts, wherein there is a second specific distance between the plurality of detection units and the corresponding light-emitting unit, and the plurality of detection units detect an electrical property generated after the light-emitting unit is illuminated with light to determine whether the light-emitting unit has defects or not.

2. The detection panel for detecting the light-emitting unit according to claim 1, wherein the plurality of detection units are disposed on the substrate in an array.

3. The detection panel for detecting the light-emitting unit according to claim 1, wherein a shape of the first detection electrode and a shape of the second detection electrode in a normal direction of the substrate include a rectangle, a rhombus, a circle, a ring or a combination thereof.

4. The detection panel for detecting the light-emitting unit according to claim 1, wherein the first detection electrode surrounds the second detection electrode.

5. The detection panel for detecting the light-emitting unit according to claim 1, wherein the first detection electrode and the second detection electrode are coplanar with each other.

6. The detection panel for detecting the light-emitting unit according to claim 1, wherein the first detection electrode and the second detection electrode are not coplanar with each other.

7. The detection panel for detecting the light-emitting unit according to claim 1, wherein one of the plurality of detection units corresponds to one of the light-emitting units.

8. The detection panel for detecting the light-emitting unit according to claim 1, wherein at least two of the plurality of detection units correspond to one of the light-emitting units.

9. The detection panel for detecting the light-emitting unit according to claim 1, wherein the light-emitting unit includes a plurality of light-emitting diodes and a carrier plate, and the plurality of light-emitting diodes are disposed on the carrier plate.

10. The detection panel for detecting the light-emitting unit according to claim 1, wherein the light-emitting unit includes a plurality of light-emitting diodes and a fixed member, and the plurality of light-emitting diodes are disposed on the detection panel by using the fixed member.

11. The detection panel for detecting the light-emitting unit according to claim 1, wherein the light-emitting unit includes a plurality of light-emitting diodes, and the plurality of light-emitting diodes are disposed on the substrate of the detection panel, and the plurality of detection units are embedded in the substrate.

12. The detection panel for detecting the light-emitting unit according to claim 1, wherein there is a third specific distance between the adjacent detection units, and the first specific distance is 2%~30% of the third specific distance.

13. A detection device for detecting a light-emitting unit, including:

a detection panel, including:

a substrate;

a plurality of detection units, disposed on the substrate, wherein one of the plurality of detection units includes a first detection electrode and a second detection electrode, and there is a first specific distance between the first detection electrode and the second detection electrode; and a plurality of first bridge parts and a plurality of second bridge parts, wherein the adjacent first detection electrodes are electrically connected to each other through one of the plurality of first bridge parts, and the adjacent second detection electrodes are electrically connected to each other through one of the plurality of second bridge parts;

an optical unit, configured to emit light to the light-emitting unit; and a control unit, coupled to the detection panel, wherein there is a second specific distance between the plurality of detection units and the corresponding light-emitting unit, and the control unit determines whether the light-emitting unit has defects or not in accordance with an electrical property generated after the light-emitting unit is illuminated with light and detected by the plurality of detection units.

14. The detection device for detecting the light-emitting unit according to claim 13, wherein the electrical property detected by the plurality of detection units includes a potential of a first electrode and a potential of a second electrode in the light-emitting unit and/or an electric field generated between the first electrode and the second electrode.

15. The detection device for detecting the light-emitting unit according to claim 13, wherein after the plurality of detection units detect the electrical property generated by the light-emitting unit being illuminated with light, the control unit determines whether the light-emitting unit has defects or not through a changed capacitance value of the plurality of detection units.

16. The detection device for detecting the light-emitting unit according to claim 13, wherein the light-emitting unit includes a plurality of light-emitting diodes, and a wavelength of the light emitted by the optical unit is smaller than a wavelength of light emitted by the plurality of light-emitting diodes.

17. The detection device for detecting the light-emitting unit according to claim 16, wherein the plurality of light-emitting diodes include horizontal light-emitting diodes or vertical light-emitting diodes.

18. The detection device for detecting the light-emitting unit according to claim 13, wherein the optical unit includes a laser unit, a light-emitting diode, a mercury vapor lamp or a combination thereof.

19. The detection device for detecting the light-emitting unit according to claim 13, wherein the optical unit emits the light to the light-emitting unit at the same time.

* * * * *